United States Patent [19]

Federspiel et al.

[11] Patent Number: 5,699,016
[45] Date of Patent: Dec. 16, 1997

[54] DIFFERENTIAL ACTIVE FILTER OF THE SECOND ORDER

[75] Inventors: Lionel Federspiel, Grenoble; Christian Perrin, Saint Georges De Commiers, both of France

[73] Assignee: SGS-Thomson Microelectronics S.A., Saint Genis, France

[21] Appl. No.: 632,880

[22] Filed: Apr. 16, 1996

[30] Foreign Application Priority Data

Apr. 26, 1995 [FR] France ............... 95 05239

[51] Int. Cl.$^6$ .................. H03F 3/45; H03F 3/191
[52] U.S. Cl. .................. 330/260; 330/306
[58] Field of Search ............. 330/69, 84, 107, 330/109, 124 R, 260, 306

[56] References Cited

U.S. PATENT DOCUMENTS 4,926,135  5/1990  Voorman ................ 330/107
5,063,356  11/1991  Voorman ................ 330/306
5,105,163  4/1992  Voorman ................ 330/107

OTHER PUBLICATIONS

French Search Report from French Patent application 95 05239, filed Apr. 26, 1995.

*Primary Examiner*—Steven Mottola
*Attorney, Agent, or Firm*—Wolf, Greenfield & Sacks, P.C.; James H. Morris

[57] ABSTRACT

A differential amplifier filter with two channels in phase opposition, wherein each channel includes the same network of passive components which includes two impedances coupled in series between a first input terminal of the filter and a corresponding input of the differential amplifier, a feed-forward impedance coupled between a common node of the two series impedances and an output of the same channel of the differential amplifier, and a feedback impedance coupled between a second input of the differential amplifier and an output of the other channel of the differential amplifier.

34 Claims, 1 Drawing Sheet

DIFFERENTIAL ACTIVE FILTER OF THE SECOND ORDER

BACKGROUND OF THE INVENTION

1. Field of the Invention

The present invention relates to active filters to process differential signals.

2. Discussion of the Related Art

In applications in which it is desired that signals be less sensitive to noise, these signals are differentially transmitted in two channels. Therefore, several causes increase the noise immunity of the signals, especially because the signals are no longer referenced with respect to a supply potential (often ground), which may be very noisy.

To filter differential signals, especially according to the second order or of a higher order, a conventional solution is to filter each component of the differential signal through a non-differential filter.

The drawback of such a filtering approach is to require two amplifiers and to have no ground noise immunity because at least one impedance of each non-differential filter is connected to ground. Furthermore, it is difficult to have the two filtered components maintain an accurate phase relation.

Differential filters are often used in interfaces between a differential signal and a non-differential signal. These interfaces are complex, especially when transforming a non-differential signal into a differential signal, because the circuit must ensure an accurate phase relation between the two differential components and a symmetrical variation of the a.c. components with respect to a predetermined common mode.

SUMMARY OF THE INVENTION

An object of the present invention is to provide a differential filter of, at least, the second order, using only one amplifier and ensuring ground noise immunity or, generally, a supply immunity.

A further object of the present invention is to provide such a filter having a simple interface between a non-differential signal and a differential signal.

To achieve these objects, the present invention disposes a filtering circuit on one of the two differential channels of a balanced differential amplifier and symmetrically duplicates this circuit on the other differential channel. A specific coupling of the impedances of the circuits prevents any coupling of the filter to a supply potential, while achieving a desired transfer function.

The invention more particularly relates to a differential amplifier filter with two channels in phase opposition. Each channel includes the same network of passive components including two impedances in series between an input terminal of the filter and a corresponding input of the differential amplifier, a feed-forward impedance coupled between a common node of the two series impedances and an output of the same channel of the differential amplifier, and a feedback impedance coupled between a differential amplifier input and an output of the other channel of the differential amplifier.

According to an embodiment of the present invention, the feedback impedance includes a resistor and a capacitor coupled in parallel.

According to an embodiment of the present invention, the series impedances are two resistors and the feed-forward impedance is a capacitor.

According to an embodiment of the present invention, the series impedances are two capacitors and the feed-forward impedance is a resistor.

According to an embodiment of the present invention, among the two series impedances, the impedance coupled to an input terminal of the filter is a resistor, and the impedance coupled to a corresponding input of the differential amplifier is a capacitor, the feed-forward impedance being a resistor.

A filter according to the present invention can be used to change a simple signal into a differential signal. In this case, an input terminal of the filter is coupled to a d.c. voltage, the other input terminal of the filter receiving the simple signal.

BRIEF DESCRIPTION OF DRAWINGS

The foregoing and other objects, features, aspects and advantages of the invention will become apparent from the following detailed description of the present invention when taken in conjunction with the accompanying drawings, in which.

DETAILED DESCRIPTION

Figure 1:
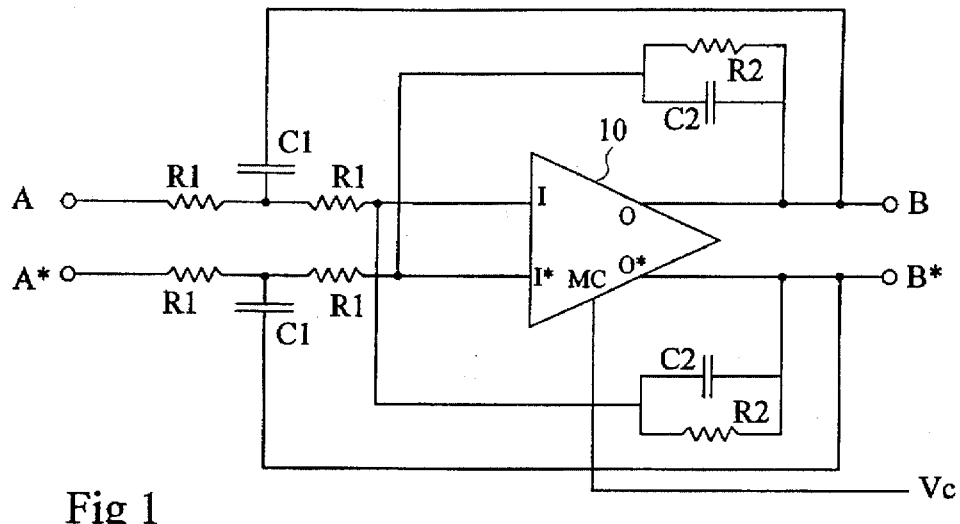
FIG. 1 represents an embodiment of a low-pass filter according to the invention.

As shown in the drawings, a differential filter according to the present invention includes a balanced differential amplifier 10 with two differential inputs, I and I*, and two corresponding differential outputs, O and O*. A first network includes feed-forward and feedback impedances coupled to one of the differential inputs and to the two differential outputs of the amplifier. An identical network is symmetrically coupled to the other differential input and to the two differential outputs.

The filter arrangement includes two differential inputs, A and A*, for applying the respective components of a differential input signal. Two differential output terminals, B and B*, corresponding to the output terminals, O and O*, of the differential amplifier, respectively, provide the respective components of the differential output signal.

Thus, path A–B constitutes a first filtering channel, and the path A*–B* constitutes a second filtering channel.

In FIG. 1, which represents a low-pass filter according to the present invention, two identical resistors R1 are serially coupled between terminal A and the first differential input I of the differential amplifier 10. A feed-forward capacitor C1 is coupled between the first differential output O and the junction of the two resistors R1. A feedback circuit is coupled between the differential input I of the differential amplifier and the second differential output O*. This feedback circuit includes a resistor R2 and a capacitor C2 coupled in parallel. The whole circuit formed by the two resistors R1, the feed-forward capacitor C1, resistor R2 and the feedback capacitor C2 constitutes the filtering network of the first channel.

The filtering network of the second channel is formed in the same way. Two resistors R1 are serially coupled between terminal A* and input I* of the amplifier. A capacitor C1 is coupled between the second output O* and the junction of the two resistors R1. A resistor R2 and a capacitor C2 are coupled in parallel between input I* and the first differential output O.

If a gain equal to 1 is desired, resistors R1 and R2 are selected, for example, such that R2=2R1=2R. The obtained transfer function for this filter is then:

$$FL(p) = \frac{1}{1 + \left(2R*C2 - \frac{1}{2}*R*C1\right)p + R^2*C1*C2*p^2} \quad (1)$$

where p is the Laplace operator.

Thus, the cut-off frequency (i.e., the frequency at which the filter has an attenuation of 3 dB) is:

$$f_L = \frac{1}{2\pi R * \sqrt{C1*C2}} \quad (2)$$

hence the quality factor of the filter is:

$$QL = \frac{\sqrt{C1*C2}}{\left(2*C2 - \frac{1}{2}*C1\right)} \quad (3)$$

As indicated in the above equations, the differential filter of the second order according to the invention enables a simple and independent regulation of the cut-off frequency and of the quality factor. The quality factor, according to equation (3), is adjusted by changing the capacitance C1 or C2 whereas the cut-off frequency is adjusted by changing the resistance R (equation (2)).

Figure 2:
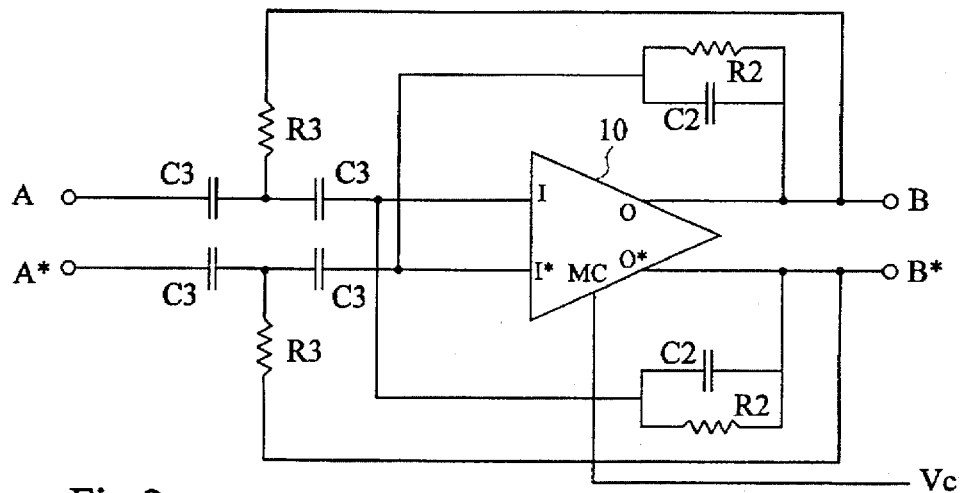
FIG. 2 represents an embodiment of a high-pass filter according to the invention.

FIG. 2 represents an embodiment of a high-pass differential filter according to the invention. The resistors R1 of FIG. 1 are replaced with capacitors C3, and the capacitor C1 of FIG. 1 is replaced with a resistor R3.

If a gain equal to 1 is desired, capacitors C2 and C3 are selected, for example, such that C3=2C2=2C. The obtained transfer function for this high-pass filter is then:

$$FH(p) = \frac{4*R3*R2*C^2*p^2}{1 + (4*R3*C - R2*C)p + 4*R3*R2*C^2*p^2}$$

Those skilled in the art can deduce from this equation the cut-off frequency and the quality factor, and notice that they can be adjusted independently one from the other.

Figure 3:
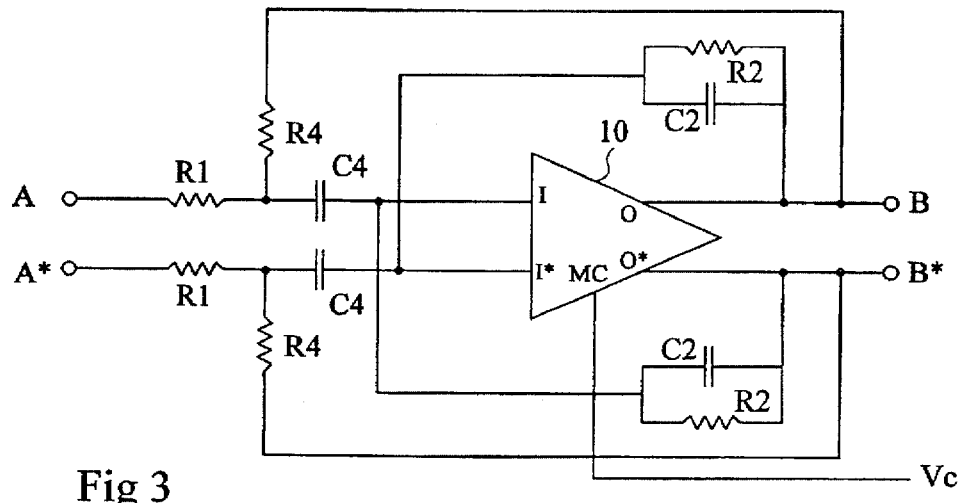
FIG. 3 represents an embodiment of a pass-band filter according to the invention.

FIG. 3 represents an embodiment of a differential band-pass filter according to the invention. With respect to FIG. 1, the capacitors C1 have been replaced with resistors R4, and the resistors R1 coupled to inputs I and I* are replaced with capacitors C4.

The transfer function of this band-pass filter is then:

$$Fb(p) = \frac{R2*R4*C4*p}{R1*R2*R4*C4*C2*p^2 + (R1*R4*C4 + R1*R2*C2 + R2*R4*C2)p + R1 + R4}$$

Those skilled in the art can deduce from this equation the cut-off frequency and the quality factor, and notice that they can be regulated independently one from the other.

A feature of a conventional balanced differential amplifier is to provide a pair of signals having a.c. components that are strictly in phase opposition, and having identical d.c. components, equal to a common mode voltage Vc which can generally be selected. The voltage Vc is then applied, as represented in the drawings, to a common mode input (MC) of the differential amplifier 10.

Furthermore, the filters above described can advantageously be directly used to change a simple signal (i.e. a non-differential signal) into a differential signal. In this case, the simple signal is applied, for example, to input A, and input A* is coupled to the common mode voltage Vc. Thus, the simple signal is changed into an ideal differential signal having a common mode corresponding to voltage Vc.

Conversely, filters can be used to change a differential signal into a simple signal by using a single output B, B*, the simple signal being referenced, for example, to the common mode voltage Vc.

Having thus described at least one illustrative embodiment of the invention, various alterations, modifications and improvements will readily occur to those skilled in the art. Such alterations, modifications, and improvements are intended to be within the spirit and scope of the invention. Accordingly, the foregoing description is by example only and is not intended to be limiting. The invention is limited only as defined in the following claims and the equivalents thereto.

What is claimed is:

1. A differential amplifier filter with two channels in phase opposition, wherein each channel includes the same network of passive components, each network comprising:

two impedances in series between an input terminal of the filter and a corresponding input of a differential amplifier, a feedback impedance coupled between a common node of the two series impedances and an output of the same channel of the differential amplifier, and a feedback impedance coupled between the input of the differential amplifier and an output of the other channel of the differential amplifier.

2. The filter of claim 1, wherein the feedback impedance includes a resistor and a capacitor coupled in parallel.

3. The filter of claim 1, wherein the series impedances are two resistors and wherein the feed-forward impedance is a capacitor.

4. The filter of claim 1, wherein the series impedances are two capacitors and the feed-forward impedance is a resistor.

5. The filter of claim 1, wherein, among the two series impedances, the impedance coupled to the respective input terminal of the filter is a resistor and the impedance coupled to the corresponding input of the differential amplifier is a capacitor, the feed-forward impedance being a resistor.

6. Utilization of the filter of claim 1 for changing a non-differential signal into a differential signal, wherein the input terminal of the filter is coupled to a d.c. voltage, and an other input terminal of the filter is coupled to the non-differential signal.

7. The filter of claim 2, wherein the series impedances are two resistors and wherein the feed-forward impedance is a capacitor.

8. The filter of claim 2, wherein the series impedances are two capacitors and the feed-forward impedance is a resistor.

9. The filter of claim 2, wherein, among the two series impedances, the impedance coupled to the respective input terminal of the filter is a resistor and the impedance coupled to the corresponding input of the differential amplifier is a capacitor, the feed-forward impedance being a resistor.

10. A differential amplifier filter circuit for filtering differential signals, comprising:

first and second input terminals;

a differential amplifier including a first amp input, a corresponding first amp output, a second amp input and a corresponding second amp output, the first and second input terminals respectively coupled to the first and second amp inputs, wherein the first amp input, first input terminal and first amp output define a first channel and the second amp input, second input terminal and second amp output define a second channel;

first and second series impedances coupled in series between the first input terminal and the first amp input;

third and fourth series impedances coupled in series between the second input terminal and the second amp input;

a first network coupled to the first amp output, the second amp input and a first common node between the first and second series impedances; and a second network coupled to the second amp output, the first amp input and a second common node between the third and fourth series impedances;

wherein the first and second networks include the same components.

11. The filter circuit as recited in claim 10, wherein:

the first network includes a first feed-forward impedance coupled between the first common node of the first and second impedances and the first amp output and a first feedback impedance coupled between the second amp input and the first amp output; and the second network includes a second feed-forward impedance coupled between the second common node of the third and fourth series impedances and the second amp output and a second feedback impedance coupled between the first amp input and the second amp output.

12. The filter circuit as recited in claim 11, wherein the first and second feedback impedances of the first and second networks each includes a resistor and a capacitor coupled in parallel.

13. The filter circuit as recited in claim 11, wherein the first, second, third and fourth series impedances are each a resistor and the first and second feed-forward impedances are each a capacitor.

14. The filter circuit as recited in claim 12, wherein the first, second, third and fourth series impedances are each a resistor and the first and second feed-forward impedances are each a capacitor.

15. The filter circuit as recited in claim 11, wherein the first, second, third and fourth series impedances are each a capacitor and the first and second feed-forward impedances are each a resistor.

16. The filter circuit as recited in claim 12, wherein the first, second, third and fourth series impedances are each a capacitor and the first and second feed-forward impedances are each a resistor.

17. The filter circuit as recited in claim 11 wherein, the first and third series impedances are each a resistor coupled to the respective input terminal, the second and fourth series impedances are each a capacitor coupled to the respective amp input and the first and second feed-forward impedances each includes a resistor.

18. The filter circuit as recited in claim 12 wherein, the first and third series impedances are each a resistor coupled to the respective input terminal, the second and fourth series impedances are each a capacitor coupled to the respective amp input and the first and second feed-forward impedances each includes a resistor.

19. A differential amplifier circuit for filtering differential signals, comprising:

first and second input terminals;

a differential amplifier including a first amp input and a corresponding first amp output, a second amp input and a corresponding second amp output wherein a first filter input terminal, the first amp input and the first amp output define a first channel and a second filter input terminal, the second amp input and the second amp output define a second channel;

first and second series impedances coupled in series between the first input terminal and the first amp input;

third and fourth series impedances coupled in series between the second input terminal and the second amp input;

first means, coupled to the first channel, for feeding back a first output signal from the first amp output to the second amp input and for feeding forward the first output signal to a first common node between the first and second series impedances;

second means, coupled to the second channel, for feeding a second output signal from the second amp output to the first amp input and for feeding forward the second output signal to a second common node between the third and fourth series impedances; and wherein the first and second means each includes a same structure of components.

20. The filter circuit as recited in claim 19 wherein:

the first means includes a first feed-forward impedance coupled between the first common node of the first and second series impedances and the first amp output and a first feedback impedance coupled between the second amp input and the first amp output; and the second means includes a second feed-forward impedance coupled between the second common node of the third and fourth series impedances and the second amp output and a second feedback impedance coupled between the first amp input and the second amp output.

21. The filter circuit as recited in claim 20 wherein the first and second feedback impedances each includes a resistor and a capacitor coupled in parallel.

22. The filter circuit as recited in claim 20 wherein the first, second, third and fourth series impedances are each a resistor and the first and second feed-forward impedances are each a capacitor.

23. The filter circuit as recited in claim 20 wherein the first, second, third and fourth series impedances are each a capacitor and the first and second feed-forward impedances are each a resistor.

24. The filter circuit as recited in claim 20 wherein the first and third series impedances are each a resistor coupled to the respective filter input, the second and fourth series impedances are each a capacitor coupled to the respective amp input and the first and second feed-forward impedances are each a resistor.

25. The filter circuit as recited in claim 21 wherein the first, second, third and fourth series impedances are each a resistor and the first and second feed-forward impedances are each a capacitor.

26. The filter circuit as recited in claim 21 wherein the first, second, third and fourth series impedances are each a capacitor and the first and second feed-forward impedances are each a resistor.

27. The filter circuit as recited in claim 21 wherein the first and third series impedances are each a resistor coupled to the respective filter input, the second and fourth series impedances are each a capacitor coupled to the respective amp input and the first and second feed-forward impedances are each a resistor.

28. A method of filtering a differential signal in a circuit including a differential amplifier, a first channel of the circuit including a first input terminal, a first amp input of the differential amplifier and a first amp output of the differential amplifier, and a second channel including a second input terminal, a second amp input of the differential amplifier and a second amp output of the differential amplifier, the method comprising the steps of:

providing a first component of the differential signal to the first input terminal;

coupling the first component to the first amp input through first and second series coupled impedances;

coupling the first amp output through a first feed-forward impedance to a first common node of the first and second series impedances;

coupling the second amp output to the first amp input through a first feedback impedance;

providing a second component of the differential signal to the second input terminal;

coupling the second component to the second amp input through third and fourth series coupled impedances;

coupling the second amp output to a second common node of the third and fourth series impedances through a second feed-forward impedance;

coupling the first amp output to the second amp input through a second feedback impedance;

selecting the first and third series impedances to be equal to one another;

selecting the second and fourth series impedances to be equal to one another;

selecting the first and second feed-forward impedances to be equal to one another; and selecting the first and second feedback impedances to be equal to one another.

29. The method as recited in claim 28 further comprising the step of: selecting the first, second, third and fourth impedances to be equal to one another.

30. The method as recited in claim 28 wherein the first and second feedback impedance selecting step includes the step of:

selecting a resistor and a capacitor coupled in parallel as each of the first and second feedback impedances.

31. The method as recited in claim 30 wherein the first and second feed-forward impedance selecting step includes the step of:

selecting a resistor as each of the first and second feed-forward impedances.

32. A method of changing a non-differential signal into a differential signal in a circuit including a differential amplifier, a first channel of the circuit including a first input terminal, a first amp input of the differential amplifier and a first amp output of the differential amplifier, and a second channel including a second input terminal, a second amp input of the differential amplifier and a second amp output of the differential amplifier, the method comprising the steps of:

providing the non-differential signal to the first input terminal;

coupling the non-differential signal to the first amp input through first and second series coupled impedances;

coupling the first amp output through a first feed-forward impedance to a first common node of the first and second series impedances;

coupling the second amp output to the first amp input through a first feedback impedance;

providing a common-mode voltage to the second input terminal;

coupling the common-mode voltage to the second amp input through third and fourth series coupled impedances;

coupling the second amp output to a second common node of the third and fourth series impedances through a second feed-forward impedance;

coupling the first amp output to the second amp input through a second feedback impedance;

selecting the first and third series impedances to be equal to one another;

selecting the second and fourth series impedances to be equal to one another;

selecting the first and second feed-forward impedances to be equal to one another; and selecting the first and second feedback impedances to be equal to one another.

33. The method as recited in claim 32 further comprising the step of:

selecting the first, second, third and fourth impedances to be equal to one another.

34. The method as recited in claim 32 wherein the first and second feedback impedance selecting step includes the step of:

selecting a resistor and a capacitor coupled in parallel as each of the first and second feedback impedances.

* * * * *